United States Patent

Rexer et al.

[11] Patent Number: 5,940,689
[45] Date of Patent: Aug. 17, 1999

[54] METHOD OF FABRICATING UMOS SEMICONDUCTOR DEVICES USING A SELF-ALIGNED, REDUCED MASK PROCESS

[75] Inventors: Christopher L. Rexer, Mountaintop; Mark L. Rineheimer, Luzerne; John M. S. Neilson, Norristown; Thomas E. Grebs, Mountaintop, all of Pa.

[73] Assignee: Harris Corporation, Melbourne, Fla.

[21] Appl. No.: 08/885,921

[22] Filed: Jun. 30, 1997

[51] Int. Cl.[6] .......................... H01L 21/332; H01L 21/00
[52] U.S. Cl. ............................................ 438/133; 438/169
[58] Field of Search .................................. 438/133, 134, 438/136, 160, 164, 166

[56] References Cited

U.S. PATENT DOCUMENTS

| | | |
|---|---|---|
| 4,952,990 | 8/1990 | Grüning . |
| 5,360,746 | 11/1994 | Terashima . |
| 5,488,236 | 1/1996 | Baliga et al. . |
| 5,489,787 | 2/1996 | Amaratunga et al. . |
| 5,506,153 | 4/1996 | Brunner et al. ............................. 437/6 |
| 5,798,287 | 8/1998 | Ronsisvalle .............................. 438/133 |
| 5,872,028 | 2/1999 | Yedinak et al. .......................... 438/133 |
| 5,874,338 | 2/1999 | Ferla et al. ............................... 438/268 |

*Primary Examiner*—Richard A. Booth
*Assistant Examiner*—Michael S. Lebentritt
*Attorney, Agent, or Firm*—Rogers & Killeen

[57] ABSTRACT

A method of fabricating a UMOS semiconductor device includes a blanket implant of an N type dopant into a surface of a substrate (for forming source regions), a high energy implant of a P type dopant into the substrate (for forming body regions), an etch through a hard mask to form trenches and mesas (each of the mesas having a source region at its top and a body region below), and concurrently (i) providing a gate dielectric on the sidewalls of the trenches and (ii) redistributing the dopants so that the body regions extend deeper into the substrate beneath the centers of the mesas than adjacent the walls of the trenches. Contact windows are etched in the mesas to allow electrical contact with the source regions and the body regions. The initial implant of P type dopant may be a blanket implant or an implant through a mask which concentrates the P type dopant in the centers of the mesas.

15 Claims, 4 Drawing Sheets

METHOD OF FABRICATING UMOS SEMICONDUCTOR DEVICES USING A SELF-ALIGNED, REDUCED MASK PROCESS

BACKGROUND OF THE INVENTION

The present invention relates to methods of manufacturing semiconductor devices, and more particularly to a method of fabricating UMOS semiconductor devices using a self-aligned, reduced mask process.

The advantages and applications of MOSFET devices are well known, as are methods of fabricating such devices. Two variations of MOSFETs have become popular, the double-diffused MOS (DMOS) device and the trench-gated MOS (UMOS) device. As illustrated in FIG. 1, MOS devices (a DMOS MOS controlled thyristor, MCT, is shown) are horizontally disposed with surface gates. In contrast, UMOS devices, such as the UMOS MCT illustrated in FIG. 2, are vertically oriented and use trenched gates. As is apparent, UMOS devices reduce cell space requirements.

The efficient fabrication of UMOS devices and the ability to manufacture UMOS devices which meet anticipated performance have been problems which have affected their utility. For example, DMOS devices are adaptable to a variety of well-known surface channel and concentric diffusion manufacturing methodologies which cannot be used in UMOS devices, and UMOS devices do not lend themselves to self-aligned processes or to processes which reduce the number of masks as obviously as comparable DMOS processes. However, such processes would make UMOS devices a more attractive alternative to DMOS devices because of the improvements in manufacturing throughput, greater UIS capability, decreased alignment sensitivity, and lower specific on-resistance.

For further background, see the discussion of DMOS and UMOS devices in U.S. Pat. No. 5,488,236 issued to Baliga, et al. Jan. 30, 1996 and an example of UMOS fabrication in U.S. Pat. No. 5,360,746 issued to Terashima Nov. 1, 1994.

Accordingly, it is an object of the present invention to provide a novel method of fabricating semiconductor devices which obviates the problems of the prior art.

It is another object of the present invention to provide a novel method of fabricating semiconductor devices which uses self-aligned implants and a reduced mask set process.

It is yet another object of the present invention to provide a novel method of fabricating semiconductor devices which uses a blanket source implant and a high energy body implant before trench and mesa formation, and a shallow etch to form source and body contacts in the mesas.

It is still another object of the present invention to provide a novel method of fabricating semiconductor devices which uses a blanket source implant and a high energy body implant before trench and mesa formation, followed by redistribution of the implanted dopants so that the body region extends deeper into the substrate beneath the centers of the mesas than adjacent the walls of the trenches.

It is a further object of the present invention to provide a novel method of fabricating a UMOS semiconductor device which includes a blanket source implant, a high energy body implant, an etch through a hard mask to form trenches and mesas, concurrently providing a gate oxide on surfaces of the trenches and mesas and redistributing the dopants so that the body dopant concentration beneath the centers of the mesas extends deeper into the substrate than adjacent the walls of the trenches, and where the initial body implant may be a blanket implant or an implant through a mask which concentrates the dopant in the centers of the mesas.

It is yet a further object of the present invention to provide a novel method of fabricating a UMOS semiconductor device in which an N type (source) dopant is blanket implanted and a P type (body) dopant is blanket implanted at high energy into the surface of a substrate; the substrate is etched through a hard mask to form trenches and mesas; the two dopants are redistributed so that the P type dopant concentration beneath the centers of the mesas extends deeper into the substrate than adjacent the walls of the trenches, the mesas are etched through a further mask to form contact windows which expose portions of the source and body regions.

It is still a further object of the present invention to provide a novel method of fabricating a UMOS semiconductor device in which an N type (source) dopant is blanket implanted and a P type (body) dopant is implanted at high energy through a mask into the surface of a substrate, the mask having first openings for the trenches and second openings over the mesas which are narrower than the mesas; the substrate is etched through a hard mask to form trenches and mesas; the two dopants are redistributed so that the P type dopant concentration beneath the centers of the mesas extend deeper into the substrate than adjacent the walls of the trenches; the mesas are etched through a further mask to form contact windows which expose portions of the source and body regions.

These and many other objects and advantages of the present invention will be readily apparent to one skilled in the art to which the invention pertains from a perusal of the claims, the appended drawings, and the following detailed description of the preferred embodiments.

In the following, first and second conductivity types are opposite conductivity types, such as N and P types. Each embodiment includes its complement as well. Note also that the figures herein illustrate vertical cross sections of devices and that the devices extend laterally (into and/or out of the page) in a manner appreciated by those of skill in the art.

DESCRIPTION OF PREFERRED EMBODIMENTS

Figure 2:
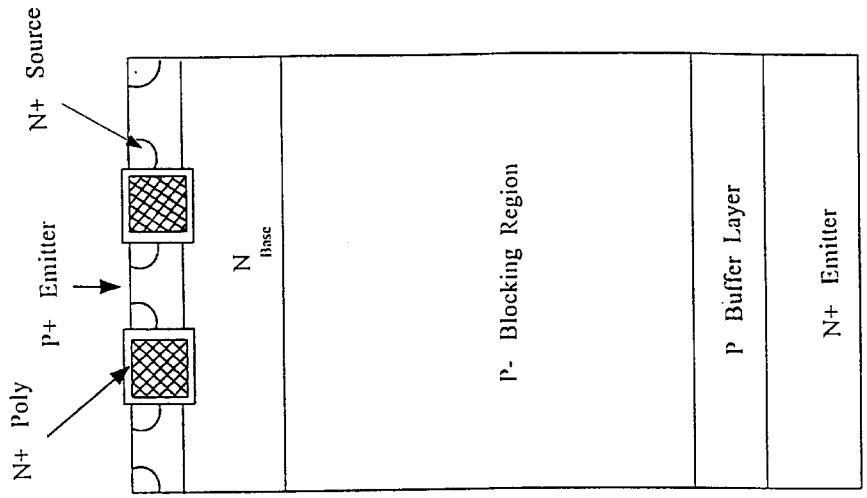
FIG. 2 is a vertical cross section of a UMOS MCT device of the prior art.
Figure 1:
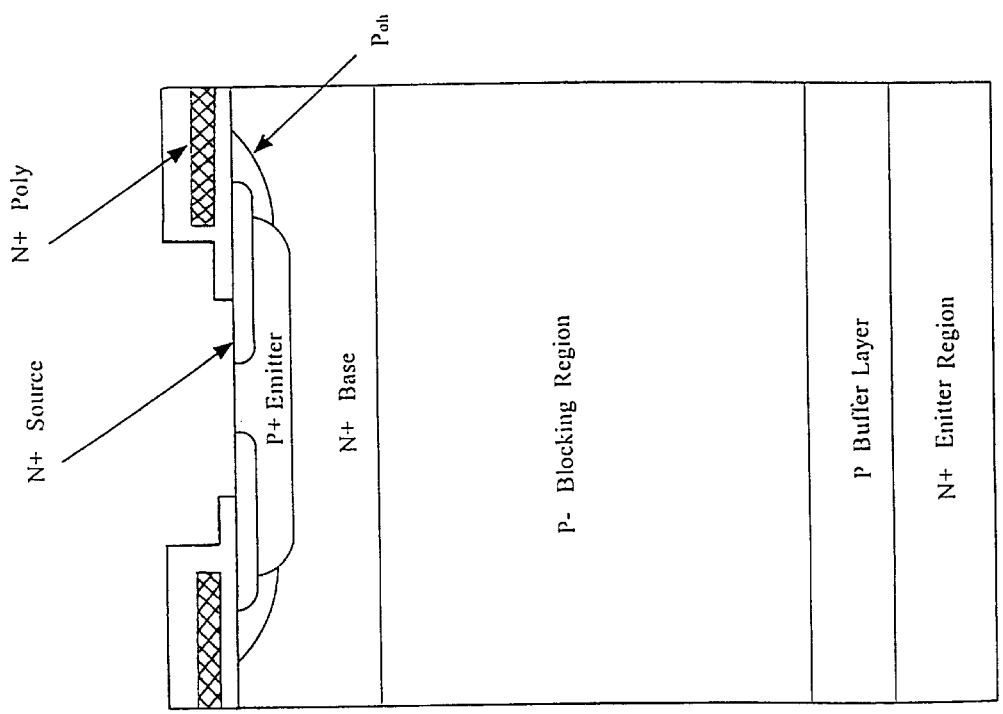
FIG. 1 is a vertical cross section of a DMOS MCT device of the prior art.
Figure 3A:
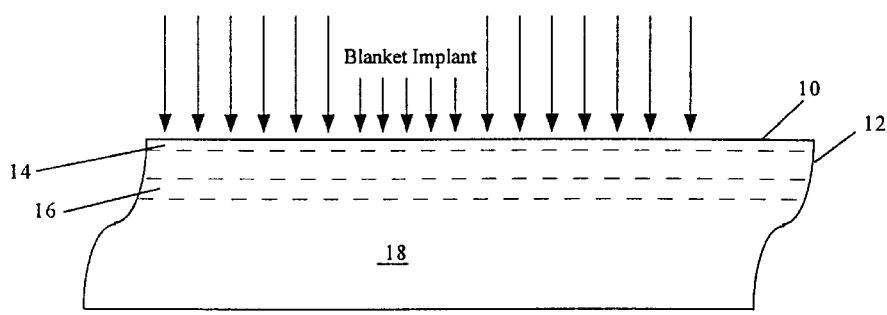
FIGS. 3a–d illustrate the sequence of steps in an embodiment of the present invention for an N-channel, trench power MOS device.
Figure 3B:
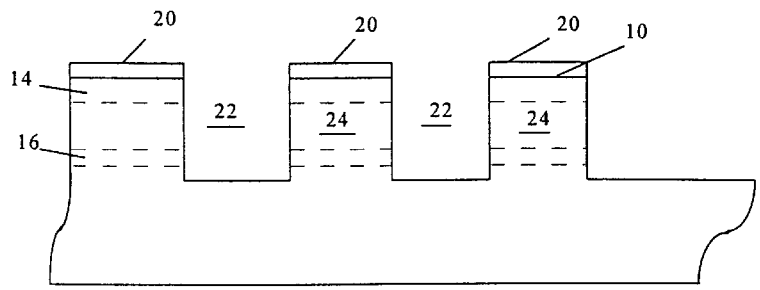
Figure 3C:
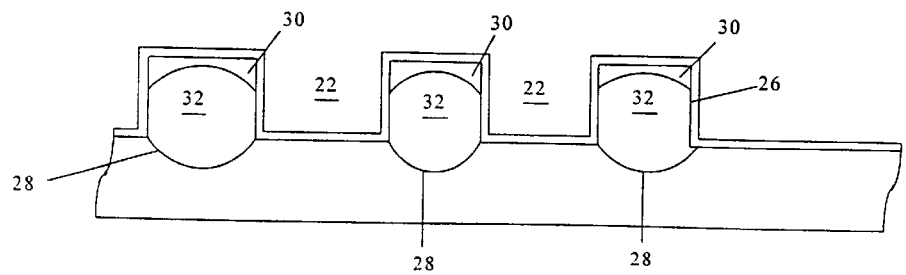
Figure 3D:
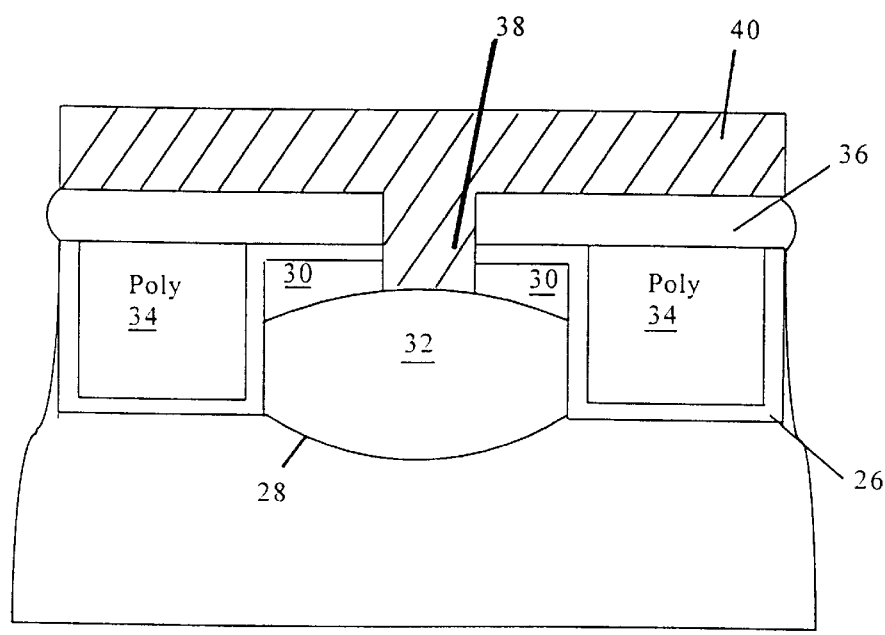

With reference now to FIGS. 3a–d, an embodiment of the method of fabricating a semiconductor device of the present invention may include blanket implanting an N type dopant (of a dose from $5 \times 10^{15}$ to $5 \times 10^{16}$ atoms/cm$^2$ at an energy from 40 to 120 kev) into a surface 10 of a semiconductor substrate 12 (blanket implant refers to an implant over an unmasked area of a substrate surface which may be the entire wafer) and blanket implanting a P type dopant of a dose from $5 \times 10^{13}$ to $1 \times 10^{15}$ atoms/cm$^2$ at an energy from 140 to 400 kev.) into surface 10 at a higher energy so as to form a first N type layer 14 near surface 10 and a second P type layer 16 deeper in substrate 12. Layer 14 will be used to form source regions, and layer 16 will be used to form body regions.

Note that the portion 18 of substrate 12 beneath the features shown herein may take any conductivity, thickness and layering appropriate for the device being fabricated. The method herein is concerned with the portion of the substrate adjacent surface 10.

Surface 10 may then be provided (e.g., grown and/or deposited) with a hard mask 20 patterned to form trenches in the substrate. Surface 10 then may be etched through the openings in hard mask 20 to form trenches 22 and mesas 24 therebetween. Hard mask 20 may be removed at this point.

A gate oxide 26 may then be grown on surfaces of the trenches and the mesas. The growth of the gate oxide has the concurrent effect of redistributing the N and P type dopants to optimize the P type dopant concentration beneath the centers of mesas 24 extends deeper into substrate 12 than adjacent the walls of the trenches 22 causing PN junction 28 to "bulge" downward. This process forms source regions 30 at the tops of mesas 24 and body regions 32 below (the depths to which these regions extend may vary from that illustrated, depending on the nature of the device, e.g., PN junctions 28 need not extend below the bottom of trenches 22, although they do in preferred embodiment).

The growth of the gate oxide causes P type dopant segregation so that the body dopant concentration is lowest along the walls of the trenches. This segregation optimizes threshold voltage while maintaining a relatively high body charge in the centers of the mesas, and thereby reduces parasitic bipolar transistor effects in the device. The growth of the gate oxide also causes the PN junction beneath the centers of the mesas to extend further into the substrate than adjacent the walls of the trenches. The deeper central region forces breakdown in the mesa rather than in the trench. This thermal process which concurrently grows the gate oxide and redistributes the dopants, should be performed at or below 1100° C. for a time sufficient to set the peak channel concentration from $1\times10^{17}$ to skid$^{17}$ atoms/cm$^3$. This relatively low temperature process enhances dopant segregation adjacent to the walls of the trench while maintaining a dopant concentration within the centers of the mesas which is high relative to that adjacent to the walls of the trench.

The following sequence of steps may be conventional, and may include deposition of polysilicon 34 and/or a high temperature refractory material in the trenches, further doping (as needed for the particular device), planarization, poly oxidation (again, as needed for the particular device), and deposition of an interlevel dielectric 36. A polysilicon mask may be used for patterning gate runners, field plates, or other structures.

An additional mask may be provided for forming contact windows in mesas 24. Mesas 24 may then be etched through the additional mask to form contact windows 38 which expose portions of source regions 30 and body regions 32. A boron enrichment step may be performed at this time, as appropriate for the device. Contact metal 40 may then be deposited to connect source regions 30 and body regions 32 through contact windows 38. A photomask may be used to pattern contact metal 40, which may be aluminum, aluminum alloys, silicides, and/or other appropriate materials.

Figure 4A:
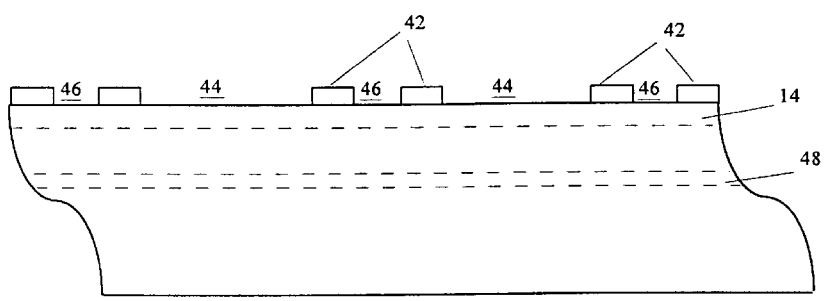
FIGS. 4a–b illustrate the sequence of initial steps in a further embodiment of the present invention.
Figure 4B:
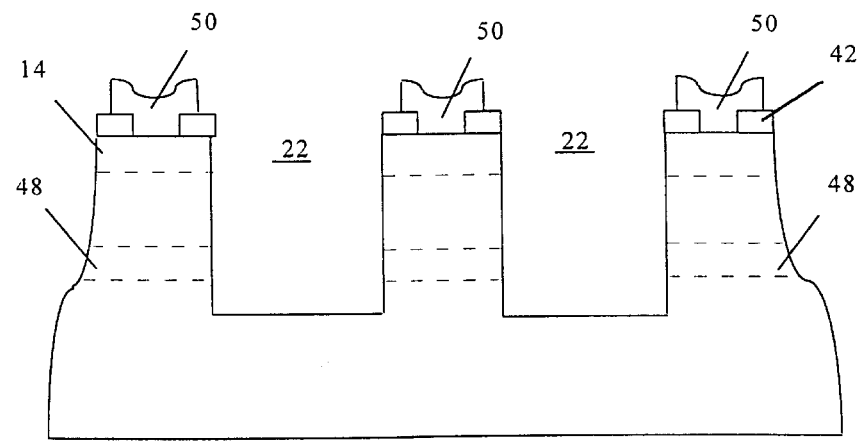

With reference now to FIGS. 4a–b, a further embodiment of the present invention may be used to provide a higher concentration of dopant at the centers of the mesas. While this alternative requires a further mask, it provides greater UIS capability and facilitates fabrication of P-channel devices.

An N type dopant may be blanket implanted as described above to form layer 14. Thereafter, a hard mask 42 may be provided which is patterned with first openings 44 over portions of the substrate where trenches are to be formed and second openings 46 over the portions of the substrate which will be centers of mesas. A P type dopant may then be implanted at a higher energy so as to form a second P type layer 48 deeper in the substrate which has gaps beneath the remaining portions of hard mask 42. As in the above, layer 14 will be used to form source regions, and layer 48 will be used to form body regions.

Each of second openings 46 may have a width narrower than the one of the mesas which is to be formed therebeneath so that the second conductivity type dopant will be concentrated at centers of the mesas when the mesas are formed. Before trenches 22 are etched, second openings 46 may be masked, for example, by depositing a sioxylene glass (SOG) 50, photoresist or similar material to protect the mesas and then removing SOG 50 over openings 44 to expose the substrate where trenches 22 are to be formed. Note that alignment of the removal of SOG 50 over openings 44 is not critical because openings 44 in hard mask 42 define the sizes of trenches 22.

The remaining steps are as described above and shown in FIGS. 3c–d. Note, however, that the central concentration of the body dopant resulting from the narrow second openings 46 causes the dopant gradient from the center of the mesas to the edge of the mesas to be greater in this embodiment than the one described above, resulting in greater UIS capability. Further, the "bulge" of the PN junction beneath the mesas will be more pronounced in this embodiment. This embodiment is also better adapted to fabrication of P-channel devices.

In an alternative embodiment for both embodiments described above, the segregation of the P type dopant by the growth of the gate oxide may be enhanced by providing a sacrificial oxide layer on the substrate surfaces prior to gate oxidation.

The method herein may be used to fabricate a variety of semiconductor devices, including FETs, IGBTs and MCTs.

While preferred embodiments of the present invention have been described, it is to be understood that the embodiments described are illustrative only, and the scope of the invention is to be defined solely by the appended claims when accorded a full range of equivalence, many variations and modifications naturally occurring to those of skill in the art from a perusal hereof.

What is claimed is:

1. A method of fabricating a semiconductor device comprising the steps of:

(a) blanket implanting a first conductivity type dopant into a surface of a semiconductor substrate of opposite conductivity type;

(b) implanting a second conductivity type dopant into the surface of the semiconductor substrate, the first conductivity type dopant for forming at least one source region of a semiconductor device and the second conductivity type dopant for forming at least one body region of the semiconductor device;

(c) etching the surface through a hard mask to form isolated or distributed trenches and mesas, each of the mesas having source regions at its top and body regions therebeneath;

(d) redistributing the first and second conductivity dopants so that the second conductivity type dopant concentration beneath the centers of the mesas extends deeper into the substrate than adjacent the walls of the trenches;

(e) forming contact windows in the mesas which expose portions of the source regions formed by the first conductivity type dopant and the body regions formed by the second conductivity type dopant; and (f) connecting the source and body regions through the contact windows.

2. The method of claim 1 wherein the step of implanting the second conductivity type dopant comprises the step of blanket implanting the second conductivity type dopant with a higher energy than the first conductivity type dopant implant so that the second conductivity type dopant extends further into the substrate than the first conductivity type dopant.

3. The method of claim 1 wherein the step of implanting the second conductivity type dopant comprises the steps of implanting the second conductivity type dopant through first and second openings in the hard mask, the first openings for forming the trenches and the second openings being over the mesas, each of the second openings having a width narrower than the one of the mesas therebeneath so that the second conductivity type dopant is concentrated within the mesas.

4. The method of claim 3 wherein the step of etching the surface through the hard mask comprises the step of masking the second openings before etching the surface.

5. The method of claim 1 wherein the step of redistributing the dopants comprises the step of providing a gate oxide on the walls of the trenches.

6. The method of claim 1 wherein the step of forming contact windows in the mesas comprises the step of etching the mesas through a further mask.

7. The method of claim 1 wherein the semiconductor device is one of a FET, an IGBT or a MOS controlled thyristor.

8. A method of fabricating a UMOS semiconductor device comprising the steps of:

(a) blanket implanting a first conductivity type dopant into a surface of a semiconductor substrate of opposite conductivity type;

(b) blanket implanting a second conductivity type dopant into the surface of the semiconductor substrate,
the first conductivity type dopant for forming at least one source region of a UMOS semiconductor device and the second conductivity type dopant for forming at least one body region of the UMOS device;

(c) etching the surface through a hard mask to form isolated or distributed trenches and mesas, each of the mesas having source regions at its top and body regions therebeneath;

(d) concurrently (i) providing a gate oxide on surfaces of the trenches and the mesas and (ii) redistributing the first and second conductivity dopants so that the second conductivity type dopant concentration beneath the centers of the mesas extends deeper into the substrate than adjacent the walls of the trenches;

(e) etching the mesas through a further mask to form contact windows which expose portions of the source regions formed by the first conductivity type dopant and the body regions formed by the second conductivity type dopant; and (f) depositing contact material to connect the plural source and body regions through the contact windows.

9. The method of claim 8 further comprising the steps, before the step of etching the mesas, of depositing one of a polysilicon or a high temperature refractory material in the trenches, planarizing the material in the trenches, and depositing an interlevel dielectric.

10. The method of claim 8 where the first conductivity type dopant is an N type dopant.

11. The method of claim 8 further comprising the step, before the step of providing the gate oxide, of providing a sacrificial oxide on surfaces of the trenches and the mesas in order facilitate the subsequent step of redistributing the dopants.

12. A method of fabricating a UMOS semiconductor device comprising the steps of:

(a) blanket implanting a first conductivity type dopant into a surface of a semiconductor substrate of opposite conductivity type;

(b) implanting a second conductivity type dopant through first and second openings in a hard mask into the surface of the semiconductor substrate,
the first conductivity type dopant for forming at least one source region of a UMOS semiconductor device and the second conductivity type dopant for forming at least one body region of the UMOS device,
the first openings for forming trenches and the second openings being over mesas between adjacent ones of the trenches, each of the second openings having a width narrower than the one of the mesas therebeneath so that the second conductivity type dopant will be concentrated within the mesas;

(c) masking the second openings;

(d) etching the surface through the first openings to form isolated or distributed trenches and mesas, each of the mesas having source regions at its top and body regions therebeneath;

(d) concurrently (i) providing a gate oxide on surfaces of the trenches and the mesas and (ii) redistributing the first and second conductivity dopants so that the second conductivity type dopant concentration beneath the centers of the mesas extends deeper into the substrate than adjacent the walls of the trenches;

(e) etching the mesas through a further mask to form contact windows which expose portions of the source regions formed by the first conductivity type dopant and the body regions formed by the second conductivity type dopant; and (f) depositing contact material to connect the plural source and body regions through the contact windows.

13. The method of claim 12 further comprising the step, before the step of providing the gate oxide, of providing a sacrificial oxide on surfaces of the trenches and the mesas in order facilitate the subsequent step of redistributing the dopants.

14. The method of claim 12 where the first conductivity type dopant is a N type dopant.

15. The method of claim 12 where the first conductivity type dopant is a P type dopant.

* * * * *

UNITED STATES PATENT AND TRADEMARK OFFICE
CERTIFICATE OF CORRECTION

PATENT NO. : 5,940,689
DATED : August 17, 1999
INVENTOR(S) : Christopher L. Rexer, Mark L. Rinehimer, John M. S. Neilson, and Thomas E. Grebs It is certified that error appears in the above-indentified patent and that said Letters Patent is hereby corrected as shown below:

Title page, item [75], Correct the spelling of the surname of the second-named inventor to read as follows:

Mark L. Rinehimer

Signed and Sealed this

Fourth Day of January, 2000

Attest:

Attesting Officer

*Acting Commissioner of Patents and Trademarks*